United States Patent [19]
Alfano et al.

[11] Patent Number: 4,956,548
[45] Date of Patent: Sep. 11, 1990

[54] ULTRAFAST OSCILLOSCOPE

[76] Inventors: Robert R. Alfano, 3777 Independence Ave., Bronx, N.Y. 10463; Ping P. Ho, 240-42 69th Ave., Douglaston, N.Y. 11362

[21] Appl. No.: 294,182

[22] Filed: Jan. 6, 1989

[51] Int. Cl.$^5$ .............................................. H01J 31/50
[52] U.S. Cl. ............................... 250/213 VT; 313/529
[58] Field of Search ................. 250/213 VT; 313/529, 313/537

[56] References Cited

U.S. PATENT DOCUMENTS

| | | | |
|---|---|---|---|
| 4,243,878 | 1/1981 | Kalibjian | 250/213 VT |
| 4,814,599 | 3/1989 | Wang | 250/213 VT |

Primary Examiner—David C. Nelms
Assistant Examiner—Sherrie Hsia
Attorney, Agent, or Firm—Irving M. Kriegsman

[57] ABSTRACT

An oscilloscope constructed for use in real time resolving an ultrafast voltage signal includes a streak camera having a transmission line photocarthode, a constant light source for illuminating the photocathode, an input coupled to the transmission line photocathode, an accelerating mesh, a pair of sweep electrodes, electron multiplication means, a phosphor screen and a DC high voltage source. In use, the voltage signal to be examined is applied to the input. When the voltage signal on propagating through the photocathode intersects in time and space on the photocathode with the light from the light source, a number of electrons proportional to the intensity of the voltage signal are emitted from the photocathode. These electrons are then accelerated, deflected by the pair of sweep electrodes, multiplied by the microchannel plate and then impinge upon the phosphor screen, creating an optical image having an intensity proportional to the number of impinging electrons. The image on the phosphor screen is recorded by a video camera, processed by a computer and then displayed on a monitor. In another embodiment, the streak camera includes a second photocathode with input signals being applied to either one or both photocathodes. In other embodiments, a photomultiplier tube having a pair of transmission line photocathodes are described.

13 Claims, 7 Drawing Sheets

ULTRAFAST OSCILLOSCOPE

BACKGROUND OF THE INVENTION

This application relates generally to oscilloscopes and more particularly to an oscilloscope for use in time resolving an ultrafast voltage signal.

Many photoelectric devices, most notable of which are the photomultiplier tube and the streak camera, have been used in the past to time resolve very short optical pulses.

Basically, a photomultiplier tube comprises a photocathode, an electron multiplier and an anode, all disposed in an evacuated glass housing, with potential differences set up between the electrodes and the electron multiplier to cause photoelectrons emitted by the photocathode when it is illuminated to pass through the electron multiplier and on to the anode.

In the operation of a photomultiplier tube a beam of light strikes the photocathode, causing a number of electrons, the number being proportional to the intensity of the incident light beam, to be emitted into the evacuated housing. These electrons are then multiplied by the electron multiplier to produce a stronger signal and, thereafter, transmitted through the housing to the anode where the electrons are collected to produce an output voltage signal.

Because of the electron multiplication, photomultiplier tubes are especially well adapted among photosensitive devices currently used to detect radiant energy in the ultraviolet, visible, and near infrared regions. Photomultiplier tubes also feature relatively fast time response.

The photocathode in a photomultiplier tube is generally arranged in either a side-on or a head-on configuration. In the side-on type configuration the photocathode receives incident light through the side of the glass housing, while, in the head-on type, light is received through the end of the glass housing. In general, the side-on type photomultiplier tube is widely used for spectrophotometers and general photometric systems. Most of the side-on types employ an opaque photocathode (reflection-mode photocathode) and a circular-cage structure electron multiplier which has good sensitivity and high amplification at relatively low supply voltage.

The head-on type photomultiplier tube has a semitransparent photocathode (transmission-mode photocathode) deposited upon the inner surface of the entrance window while in the side-on type, the photocathode is a separate structure. Because the head-on type provides better uniformity and lower noise, it is frequently used in scintillation and photon counting applications.

The electron multiplier in a photomultiplier tube is usually in the form of either a series of electrodes, called dynodes, or a microchannel plate. As is known, a microchannel plate (MCP) is a form of secondary electron multiplier consisting of an array of millions of glass capillaries (channels) having an internal diameter ranging from 10 um to 20 um fused into the form of a thin disk less than 1 mm thick. The inside wall of each channel is coated with a secondary electron emissive material having a proper resistance, and both ends of the channel are covered with a metal thin film which acts as electrodes, thus each channel becomes an independent secondary electron multiplier.

When a voltage is applied between both sides of the MCP, an electric field is generated in the direction of the channel axis. When an electron hits the entrance wall of the channel, secondary electrons are produced. These secondary electrons are accelerated by the electric field and travel along the parabolic trajectories determined by their initial velocity. Then they strike the opposite wall and produce other secondary electrons. This process is repeated many times along the channel, and, as a result, the electron current increases exponentially towards the output end of the channel.

The photocathode in a head-on type photomultiplier tube is generally circularly shaped and in a side-on photomultiplier tube is usually in the shape of a portion of a cylinder.

One of the limitations of photomultiplier tubes is that although they have a relatively fast time response, they are not capable of time resolving luminous events in the picosecond time frame. On the other hand, an optoelectric device that does have the capability of time resolving luminous events in the picosecond time frame is the streak camera.

Streak cameras are over fifteen years old in the art and have been used, hitherto, to directly measure the time dynamics of luminous events (i.e. to time resolve a light signal). A typical streak camera includes an entrance slit which is usually rectangular, a streak camera tube, input relay optics for imaging the entrance slit onto the streak camera tube, appropriate sweep generating electronics, electron accellerating means, and output-relay optics for imaging the streak image formed at the output end of the streak camera tube onto an external focal plane. The image at the external local plane is then either photographed by a conventional still camera or by a video camera. The streak camera tube generally includes a photocathode, an accelerating mesh, sweeping electrodes, and a phosphor screen. The streak camera tube may also include a microchannel plate. Light incident on the entrance of the streak camera is converted into a streak image from the start of the streak to the end of the streak corresponding to the intensity of the light incident thereon during the time window of the streak. The time during which the electrons are swept to form the streak image is controlled by a sweep generator which supplies a very fast sweep signal to the sweeping electrodes. The input optics of the streak camera may comprise a single lens.

U.S. Pat. No. 4,659,921 to Alfano, a streak camera which can be gated on and off over an ultrashort time window, such as in picoseconds or femtoseconds, is disclosed. The device includes, in one embodiment, an input slit for receiving a light signal, relay optics, a sweep generator and a tubular housing, the tubular housing having therein a photocathode, an accelerating mesh, a pair of sweeping electrodes, a microchannel plate, a variable aperture and a dynode chain. Light received at the input slit is imaged by the relay optics onto the photocathode. Electrons emitted by the photocathode are conducted by the accelerating mesh to the sweeping electrodes where they are swept transversely across the tubular housing at a rate defined by the sweep generator over an angular distance defined by the sweeping electrodes, in a similar manner as in a typical streak camera. Swept electrons strike the microchannel plate where electron multiplication is accomplished. Exciting electrons which pass through the variable aperture and which strike the first dynode (cathode) in the dynode chain are further multiplied and outputed from the last dynode anode in the dynode chain as an analog electrical signal, the analog electrical signal corresponding to the intensity of the light signal during the time window over which swept electrons are picked up by the first dynode. In another embodiment of the invention all of the dynodes in the chain except for the last dynode are replaced by a second microchannel plate.

In U.S. Pat. No. 4,467,189 to Tsuchiya, a streak camera is disclosed which includes a cylindrical airtight vacuum tube, a shutter plate, and a ramp generator. The container has a photocathode at one end thereof and a flourescent screen at the other end thereof which is opposite to the photocathode. The shutter plate is disposed between and parallel to the surface of the photocathode and fluorescent screen and has a multiplicity of through holes perforated perpendicular to its surface. The shutter plate also carries at least three electrodes that are disposed perpendicular to the axis of the through holes and spaced parallel to each other. The electrodes divide the surface of the shutter plate into a plurality of sections. The ramp generator is connected to the electrodes. The ramp voltage generated changes in such a manner as to reverse its polarity, producing a time lag between the individual electrode. Developing an electric field across the axis of the through holes in the shutter screen, the ramp voltage controls the passage of the electron beams from the photocathode through the through holes. A framing camera includes the above-described framing tube and an optical system. The optical system includes a semitransparent mirror that breaks up the light from the object under observation into a plurality of light components and a focusing lens disposed in the path through which each of the light components travels. Each of the light components corresponds to each of the sections on the shutter plate. The images of a rapidly changing object are produced, at extremely short time intervals, on different parts of the fluorescent screen.

As can be appreciated, the streak camera devices described above are useful only for time resolution of optical pulses.

In copending application by Alfano et al., Ser. No. 091,123, filed Aug. 31, 1987, there is disclosed a photomultiplier tube constructed for use in either time resolving an ultrafast test voltage signal or time resolving an ultrafast optical pulse. The photomultiplier tube comprises a housing having therein a photocathode for receiving incident light and producing emission of electrons in proportion to the intensity of the light, the photocathode having a transmission strip line configuration, an accelerating mesh for accelerating electrons emitted by the photocathode, a microchannel plate for performing electron multiplication on the electrons emitted from the accelerating means, an anode for receiving electrons from the microchannel plate and producing an analog electrical signal output, a power supply for use in applying a biasing voltage across the photomultiplier tube so that electrons emitted by the photocathode will be conveyed through the accelerating mesh and the microchannel plate and onto the anode, and cables connected to the photocathode for receiving and transmitting an ultrafast voltage signal.

It is an object of this invention to provide a new and improved oscilloscope.

It is another object of this invention to provide an oscilloscope for use in time resolving an ultrafast test voltage signal.

It is a further object of this invention to provide an oscilloscope as described above which includes a streak camera.

It is still a further object of this invention to provide an oscilloscope as described above which includes a specially designed photomultiplier tube.

It is yet still a further object of this invention to provide an oscilloscope as described above for use in time resolving an ultrafast voltage signal with minimal background noise.

It is another object of this invention to provide a photomultiplier tube having a photocathode in the form of transmission stripline whose width is matched to the output slit size of a spectrometer whose output is detected by the photomultiplier tube or matched to the cross sectional size and shape of a fiber optics bundle connecting the spectrometer to the photomultiplier tube.

SUMMARY OF THE INVENTION

An oscilloscope for use in time resolving an ultrafast voltage signal constructed according to one embodiment of the present invention comprises a streak camera including a housing in which there is disposed a photocathode having a transmission line configuration, means connected to the photocathode for receiving a voltage signal to be examined, a constant DC light source for illuminating the photocathode, a number of electrons being emitted from the photocathode when the beam of light from the constant DC light source and the voltage signal intersect in place and time on the photocathode, the number of electrons being proportional to the intensity of the voltage signal, an accelerating mesh deflection means for angularly deflecting the electrons as a function of time, electron multiplication means for performing electron multiplication on the electrons passed through the deflection means, a phosphor screen for receiving the electrons from the electron multiplication means and for producing a light image proportional in intensity to the number of electrons impinging thereon, and accellerating means for causing electrons emitted by the photocathode to move through the accelerating mesh, the deflection means, the electron multiplication means, and onto the phosphor screen.

The oscilloscope also includes a video camera, such as a vidicon or a SIT camera or a CCD camera, disposed in proximity to and focussed on the phosphor screen, the video camera being used to record the streak image on the phosphor screen, a computer coupled to the output of the video camera, the computer being used to convert the streak image into digital information to process the information, to generate a time resolved profile based on the digital information, and a monitor electrically coupled to the computer to display the time resolved profile.

In another embodiment of the invention, the oscilloscope is specifically constructed so as to minimize voltage readings attributable to background noise and dark current. More specifically, the streak camera portion oscilloscope further comprises a second transmission line photocathode and a second phosphor screen, both of which are disposed within the housing in proximity to the first photocathode and phosphor screen, respectively. The second photocathode is not arranged to receive the voltage signal. Consequently, only a background level of electrons, representing background noise are emitted from the second transmission line photocathode. These background electrons travel through the housing and form a light image on the second phosphor screen just as the electrons emitted from the first photocathode travel through the housing and form an image on the first phosphor screen. A second TV camera, focused on the second phosphor screen, records the image formed on the second phosphor screen and conveys this information to the computer. The computer then digitizes this light image, and then subtracts it from the light image from the first phosphor screen to yield a background-corrected time resolved profile of the voltage signal.

In still another embodiment of the invention the photoelectric portion of the oscilloscope includes a photomultiplier tube having a pair of transmission line photocathodes rather than a streak camera tube having a pair of transmission line photocathodes.

Various features and objects will appear from the description to follow. In the description, reference is made to the accompanying drawings which form a part thereof, and in which is shown by way of illustration, specific embodiments for practicing the invention. These embodiments will be described in sufficient detail to enable those skilled in the art to practice the invention, and it is understood that other embodiments may be utilized and that structural changes may be made without departing from the scope of the invention. The following detailed description is, therefore, not to be taken in a limiting sense, and the scope of the present invention is best defined by the appended claims.

BRIEF DESCRIPTION OF THE DRAWINGS

In the drawings wherein like reference numerals represent like parts:

FIG. 3(C) is a view taken from the front of a modification of the photocathodes and connecting circuitry shown in FIG. 3(A);

DETAILED DESCRIPTION OF PREFERRED EMBODIMENTS

The present invention is directed to a new and novel oscilloscope for use in time resolving an ultrafast voltage signal. The voltage signal may be as short as one picosecond. The present invention accomplishes this in one embodiment by propagating the voltage signal through the photocathode in a streak camera, the photocathode being illuminated with light from a constant or long pulse light source. When the optical pulse and the electrical signal intersect in time and space on the photocathode, a number of electrons proportional to the intensity of the voltage signal are emitted from the photocathode. These electrons are then accelerated through the streak camera tube (or housing) towards a phosphor screen. Before the electrons reach the phosphor screen, they are swept (or deflected) by a pair of deflection (sweeping) electrodes. The sweeping temporally resolves the electrons since the electrons are angularly deflected as a function of time. From the sweeping electrodes, the electrons continue to travel through the housing along their respective trajectories until they reach a microchannel plate. The microchannel plate, which is made up of secondary emissive material, multiplies the electrical signal along each trajectory by emitting a number of electrons for each electron impinging thereon. Finally, the electrons impinge upon the phosphor screen, creating an optical image having an intensity proportional to the number of impinging electrons. The image is recorded by a video camera and processed by a computer. The end result is a time resolved profile of the test voltage signal which may then be displayed on a monitor.

Figure 1:
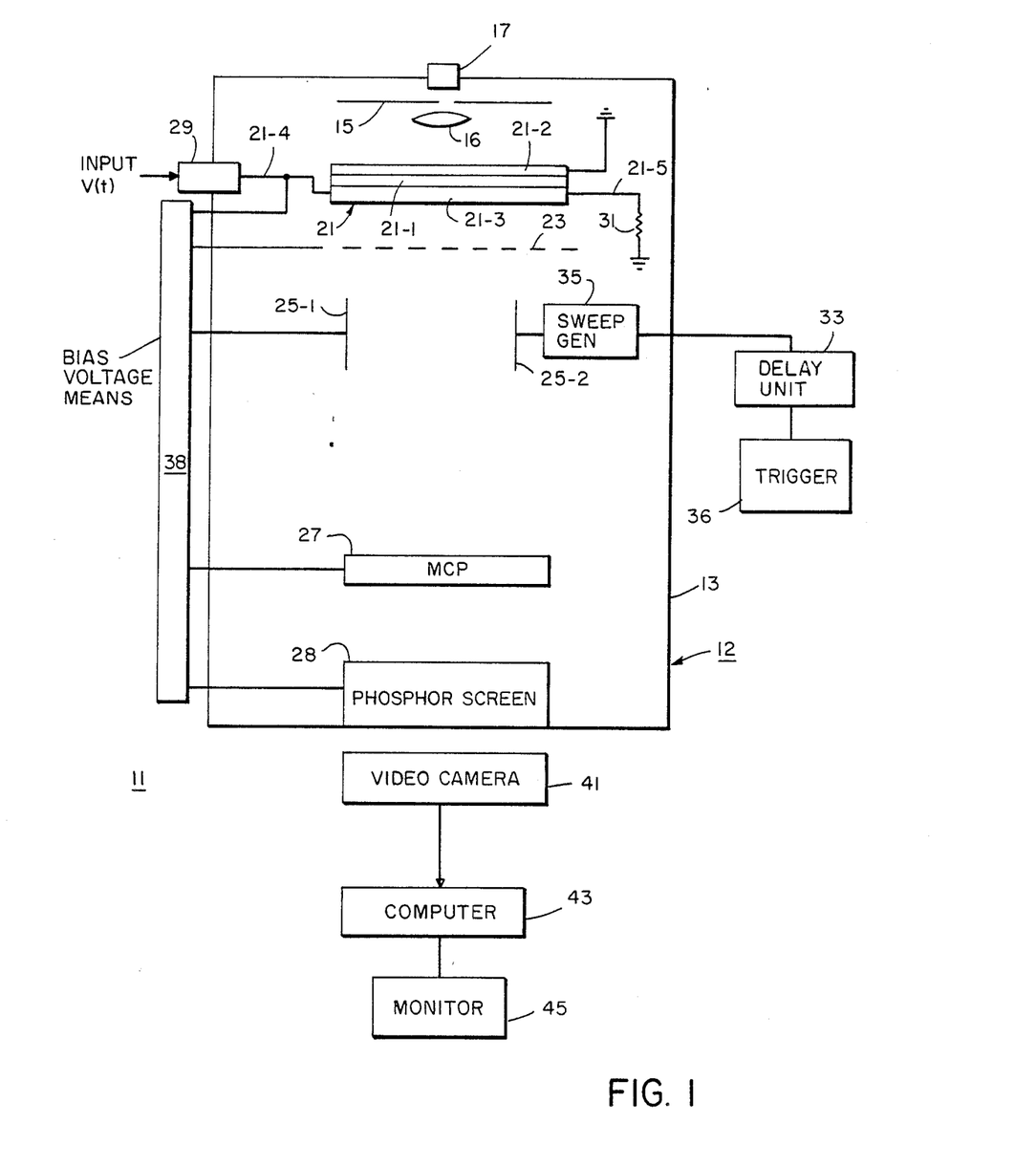
FIG. 1 is a schematic diagram taken from the top of one embodiment of an oscilloscope constructed according to the teachings of the present invention.

Referring now to the drawings, there is shown in FIG. 1 a top view an embodiment of an oscilloscope constructed according to the teachings of this invention and identified by reference numeral 11. Parts of oscilloscope 11 not pertinent to the invention are not shown.

Oscilloscope 11 comprises a streak camera 12. Camera 12 includes a housing 13. A constant DC or pulse light source 17 is mounted on the front end of housing 13.

Light source 17 may be for example, a CW laser such as a helium neon laser, a diode laser, an SHG YAG laser, a flash lamp, a LED or any source that generates pulses at greater than about 10 nanoseconds.

Disposed inside housing 13 are an aperture 15, a photocathode 21, optics 16 for adjusting the uniformity of the illumination across photocathode 21, an accelerating mesh 23, a pair of sweeping (deflection) electrodes 25-1 and 25-2, a microchannel plate 27, and a phosphor screen 28.

Figure 2A:
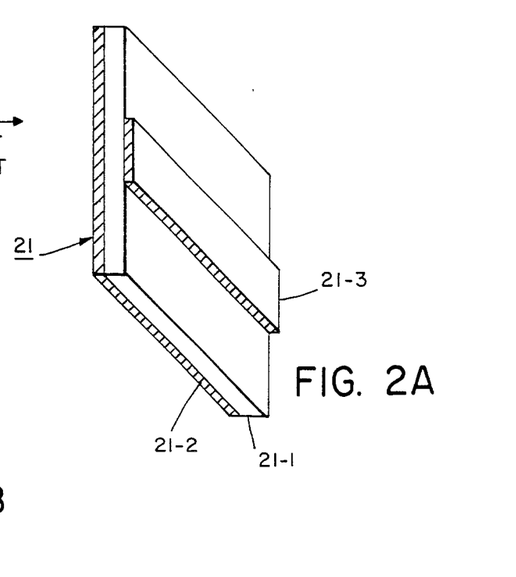
FIG. 2(A) is a perspective view of the transmission line photocathode shown in FIG. 1.

Housing 13, mesh 23, sweeping electrodes 25-1 and 25-2, microchannel plate 27, and phosphor screen 28 are of the same construction as in a conventional streak camera. However, because the temporal width of the voltage signal to be analyzed is in the picosecond range, it is necessary to modify the construction of the photocathode in the streak camera 12 so that it can faithfully carry signals of this duration. Accordingly, photocathode 21 is constructed in a transmission strip line configuration. In the embodiment shown, the particular transmission line configuration employed is a microstrip line (see FIG. 2(A)) and includes a substrate 21-1 made of a semitransparent or translucent dielectric material such as glass, a layer 21-2 of a suitable transparent or translucent conductive material such as copper or gold deposited on the front side of substate 21 and a layer 21-3 of a suitable opaque or semi-opaque photoconductive material on the back side of substrate 21-1. The type of material chosen for photoconductive layer 21-3 is a primary determinant of the frequency range of light radiation that the photocathode will respond to. Examples of some but not all of the photosensitive materials that may be used for upper conductor 21-1 and the frequency range to which they will respond are as follows: Sb-Cs, ultraviolet to visible; GaAs-Cs, 300 to 900 nm; Ag-O-Cs, visible to 1000 nm; Sb-K-Cs, ultraviolet to visible; and Na-K-Sb-Cs, ultraviolet to near infrared.

Figure 2B:
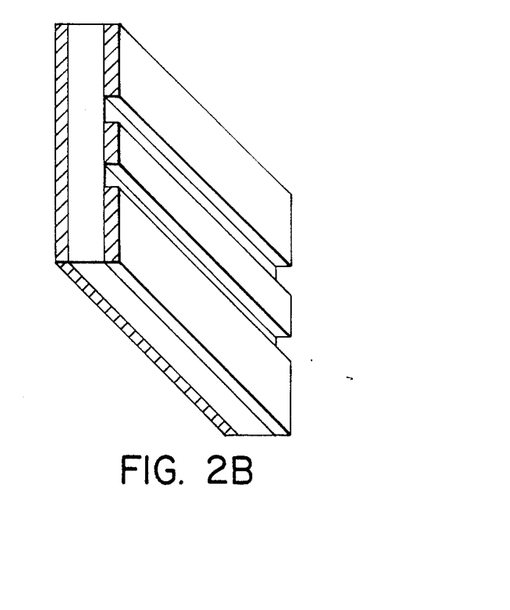
FIGS. 2(B), 2(C) are perspective views of other embodiments of the transmission line photocathode according to this invention.
Figure 2C:
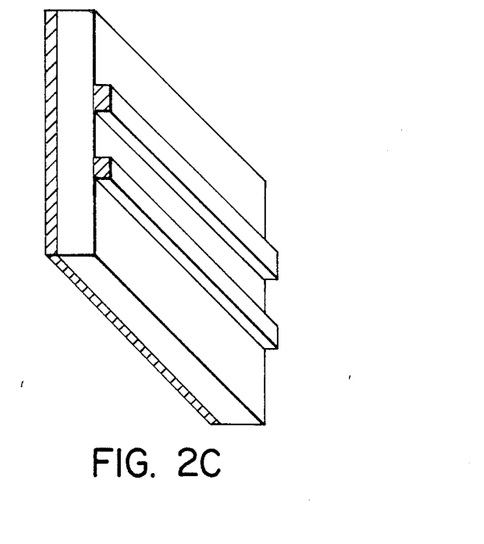

Other transmission line configurations that may be employed include coplanar waveguide 22-2 (FIG. 2(B)) and coplanar strips 22-3 (FIG. 2(C)).

Photoconductive layer 21-3 of photocathode 21 is connected at one end through a line 21-4, which may be either a transmission line or a coaxial cable, to an input terminal 29 and at the other end through a line 21-5 to ground through a resistor 31. Layer 21-2 is connected to ground through a line 21-11. In use, a voltage signal V(t) to be examined is applied to input terminal 29 and propagates across layer 21-3 of photocathode 21.

At the same time that voltage signal V(t) is sent propagating through photocathode 21, a trigger pulse from a trigger device 36 such as a pin diode triggers a sweep generator 35. The trigger pulse is produced in response to a signal received from an external source (not shown) and delayed as needed by a delay unit 33 to cause a sweep at the same time as electrons are emitted from photocathode 21. Sweep generator 35 produces a sweeping voltage which is transmitted to sweeping (or deflection) electrodes 25-1 and 25-2.

A high DC bias voltage source and appropriate voltage divider circuitry shown collectively as block 38 and identified as bias voltage means is coupled between layer 21-3 on photocathode 21, mesh 23, deflection plates 25, microchannel plate 27 and phosphor screen 28 so that electrons emitted from photocathode 21 will be accellerated through housing 13 to phosphor screen 28. The particular construction of bias voltage means 38 is not a part of this invention.

Oscilloscope 11 further includes a video camera 41, such as a vidicon or a CCD camera or a silicon intensified target (SIT) camera, which is focused on phosphor screen 28 to record the light intensity (i.e. brightness) of the image generated thereon. Video camera 41 is electrically connected to a computer 43, which receives the analog light signal from camera 41, digitizes the image, processes the information as required and then produces a time resolved profile of the voltage signal V(t). A monitor 45, connected to computer 43, may then be used to display the time resolved profile.

In using oscilloscope 11, light source 17 is activated so that a constant beam of light radiates outward therefrom to slit 15 where it is imaged by optics 16 onto photocathode 21. In the absence of a voltage signal V(t), a small number of electrons, constituting background noise will be emitted from photocathode 21.

When the test voltage signal V(t) propogates through photocathode 21 and intersects in space and time with the light incident thereon from source 13, additional electrons are emitted into housing 13 and directed towards phosphor screen 28. The number of electrons emitted by photocathode 21 at any particular place and time is proportional to the intensity of test voltage signal V(t). As the emitted electrons traverse housing 13, propelled by the force of the potential difference established by bias voltage from bias voltage means 38, a trigger pulse from trigger 36 triggers the emission of a sweeping voltage from sweep generator 35. The sweeping voltage is then conveyed to sweeping electrodes 25-1 and 25-2, causing an increasing potential difference to be established therebetween. Consequently, as the electrons pass between electrodes 25-1 and 25-2, their trajectories are deflected by a fixed amount, which is time dependent. However, because the degree of deflection is directly related to when the electrons passed between electrodes 25-1 and 25-2, the spatial differences between the electrons become temporally distinguishing. Eventually, the electrons impinge upon the phosphor screen, causing a light image proportional in intensity to the number of electrons impinging thereon to appear. Video camera 41 monitors this image and conveys the analog information derived therefrom to computer 43. The analog information is then digitized and analyzed by microprocessor 43. The end product of this analysis is a time resolved profile, which may then be displayed on monitor 45.

As noted above, some electrons are emitted from photocathode 21 that are not attributable to the intersection of the optical pulse and the voltage signal but rather the result of background noise from the light source and from dark current. The result is that the readings do not possess the desired accuracy.

One way to effectively eliminate background noise is to record the light image on phosphor screen 28 in the absence of voltage signal V(t) and the light image resulting from background noise plus voltage signal V(t) and then subtracting the former image signals from the latter image signals in computer 43.

Figure 3:
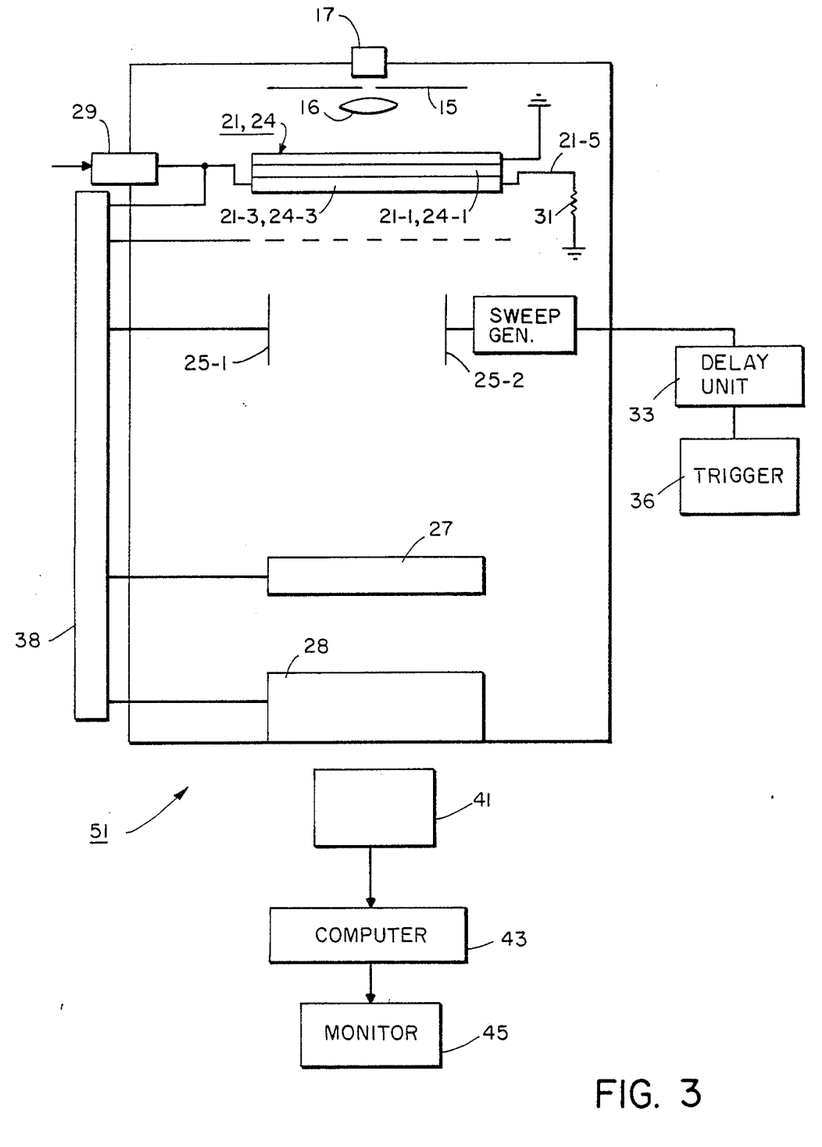
FIG. 3 is a schematic diagram taken from the top of another embodiment of an oscilloscope constructed according to the teachings of the present invention.

Referring now to FIG. 3 there is shown an oscilloscope 51 which has been specifically designed according to this invention to implement another technique to correct for readings attributable to background noise. The Figure is taken from the top of oscilloscope 51.

Figure 3A:
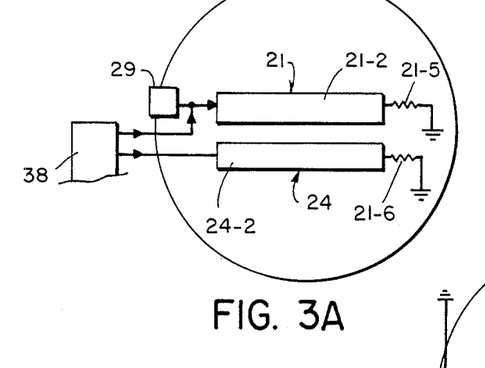
FIG. 3(A) is a view taken from the front of the photocathodes shown in FIG. 3; along with the connecting circuitry.
Figure 3B:
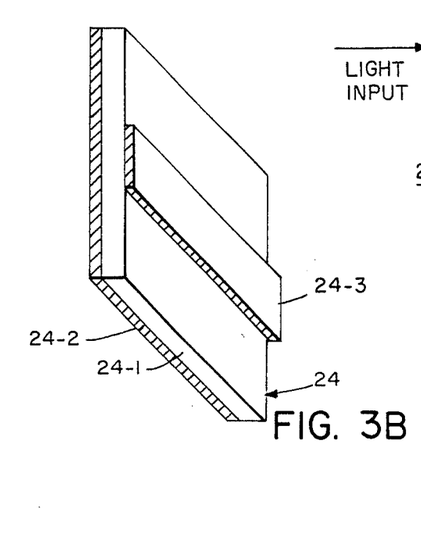
FIG. 3(B) is a perspective view of stripline photocathode 24 shown in FIG. 3.

Oscilloscope 51 is identical to oscilloscope 11, save the following features:

First, streak camera 52 of oscilloscope 51 further includes a second transmission line photocathode 24, disposed vertically underneath photocathode 21, see also FIG. 3(A), identical in construction to photocathode 21, but not electrically connected to receive the voltage signal V(t) being examined. However, despite this difference, photocathodes 21 and 24 are situated similarly in every other respect. For instance, photocathode 24 is disposed close enough to photocathode 21 so that the beam of light from light source 13 impinges on both photocathodes simultaneously. Additionally, photocathodes 21 and 24 are connected in parallel to the accellerating means 38 also, photocathode 21 is coupled to ground through a resistor 21-5 and photocathode 24 coupled to ground through a resistor 21-6. Consequently, the number of electrons emitted by photocathode 24 that are attributable to background noise will be the same as the number of electrons emitted by photocathode 21 that are attributable to background noise.

Optics 16 images light of about equal intensity from aperture 15 onto both photocathodes. In use, two spatially separated light images are formed on phosphor screen 28, one from photocathode 24 and the other from photocathode 21. Both images are recorded by camera 41 and fed into computer 43. After digitizing the image signals and generating time resolved profiles of the two image signals, computer 43 can then be used to subtract the background noise from the test voltage signal by simply subtracting the digitized image signals obtained due to photocathode 24 from the digitized image signals obtained due to photocathode 21 to yield a more accurate time resolved profile of the test voltage signal. This background-corrected profile (or either of the component profiles) may then be displayed on monitor 45.

Operation of oscilloscope 51 is accomplished substantially in the manner described in connection with streak camera system 11. The most important difference is that the beam of light from light source 17 on passing through the slit illuminates both photocathodes 21 and 24.

Instead of a single phosphor screen 28, a pair of phosphor screens of sufficient size could be employed, one for each photocathode and instead of one camera, a pair of cameras could be employed one for each image. Also, if desired, another input terminal 29-1, see FIG. 3C, could be provided and connected to photocathode 24. Then, voltage signals could be applied to either one or both photocathodes 21 and 24.

Figure 4:
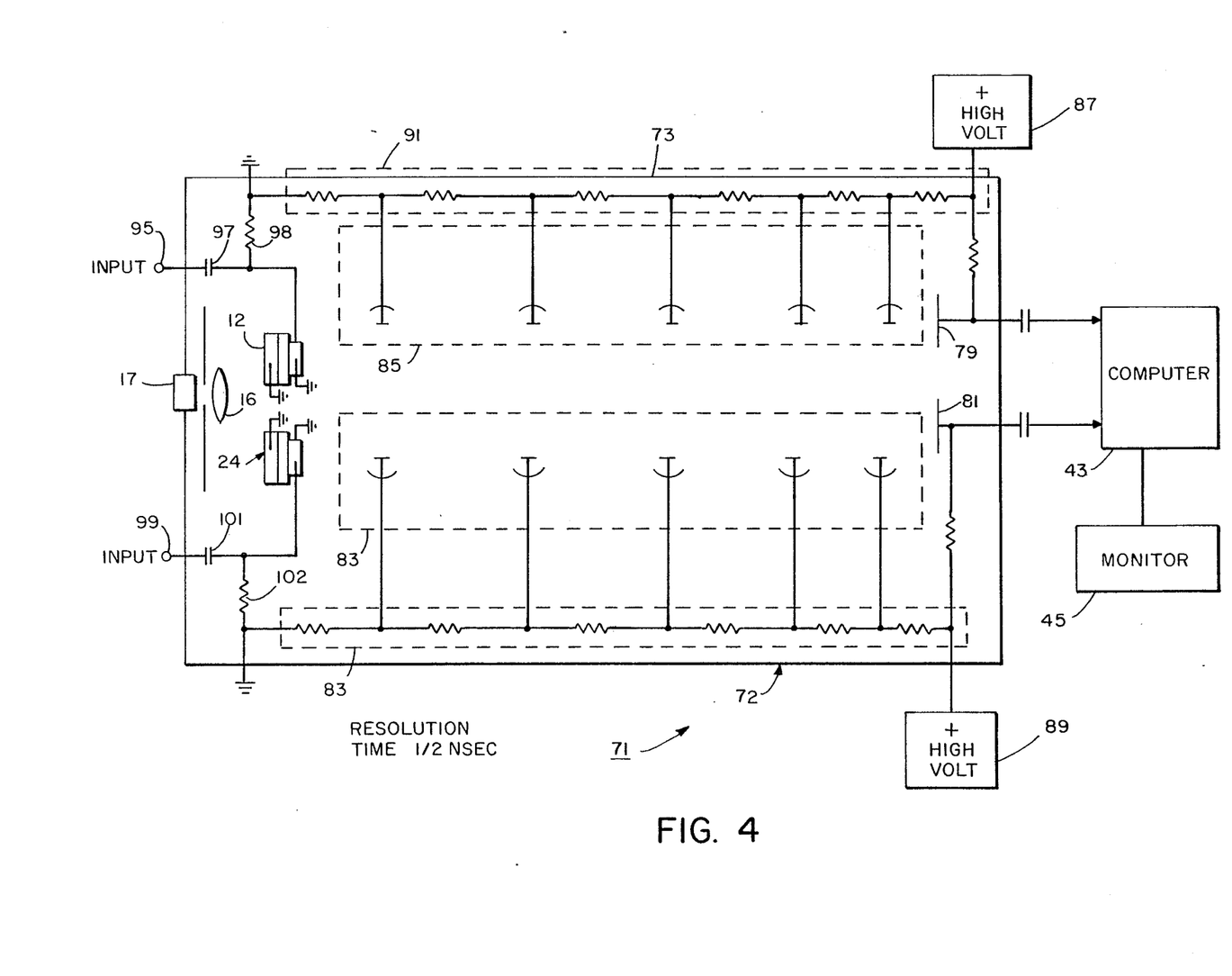
FIG. 4 is a schematic diagram taken from the side of another embodiment of an oscilloscope constructed according to the teachings of the present invention.
Figure 4A:
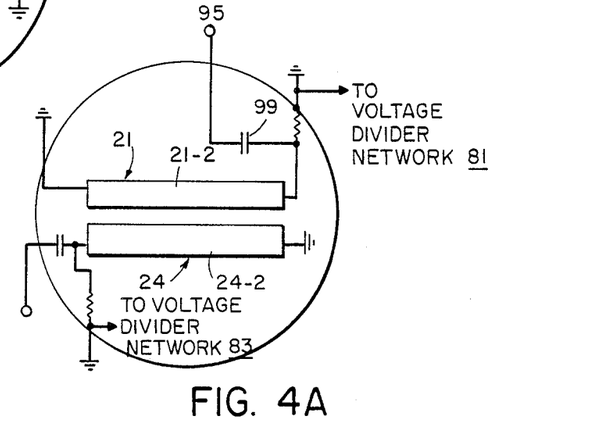
FIG. 4(A) is a view taken from the front of the photocathodes shown in FIG. 4 along with the connecting circuitry.

In FIG. 4 there is shown another embodiment of an oscilloscope according to this invention, the embodiment being a variation of the FIG. 3 embodiment using a photomultiplier tube rather than a streak camera construction and with an input connected to each photocathode rather than merely one photocathode and being identified by reference numeral 71.

Oscilloscope 71 includes a photomultiplier tube 72 which includes a housing 73 having therein a pair of transmission line photocathodes 21 and 24, a pair of anodes 79 and 81 and a pair of dynode chains 83 and 85. A pair of positive high voltages 87 and 89, respectively, provide bias voltages to the components through divider circuits 91 and 93. An input terminal 95 is connected to one end of layer 21-3 of photocathode 21 through a capacitor 97 and to ground through an impedence machine, resistor 98. The other end of layer 21-3 is connected to ground. An input terminal 99 is connected to one end of a layer 24-3 of photocathode 24 through a capacitor 101 and to ground through an impedence resistor 102. The other end of layer 24-3 is connected the ground. A constant light source 17 provides light to an aperture 103 which is then imaged by optics 16 onto the two photocathodes. Coaxial cables or transmission lines are used to connect the photocathodes to input ports 95 and 99. Layers 21-1 and 24-1 are connected to ground.

In the operation of oscilloscope 71, one input voltage signal is applied to one photocathode and another voltage signal is applied to the other photocathode. The electron output of photocathode 21 is multiplied by dynode chain 83 and collected by anode 79 while the electron output of photocathode 24 is multiplied by dynode chain 85 and collected by anode 81. The output of each anode is digitized and processed in a computer 43 and then displayed on monitor 45 either as separate images are as a single combined image. If desired, a voltage signal may be applied only to one photocathode.

Figure 5:
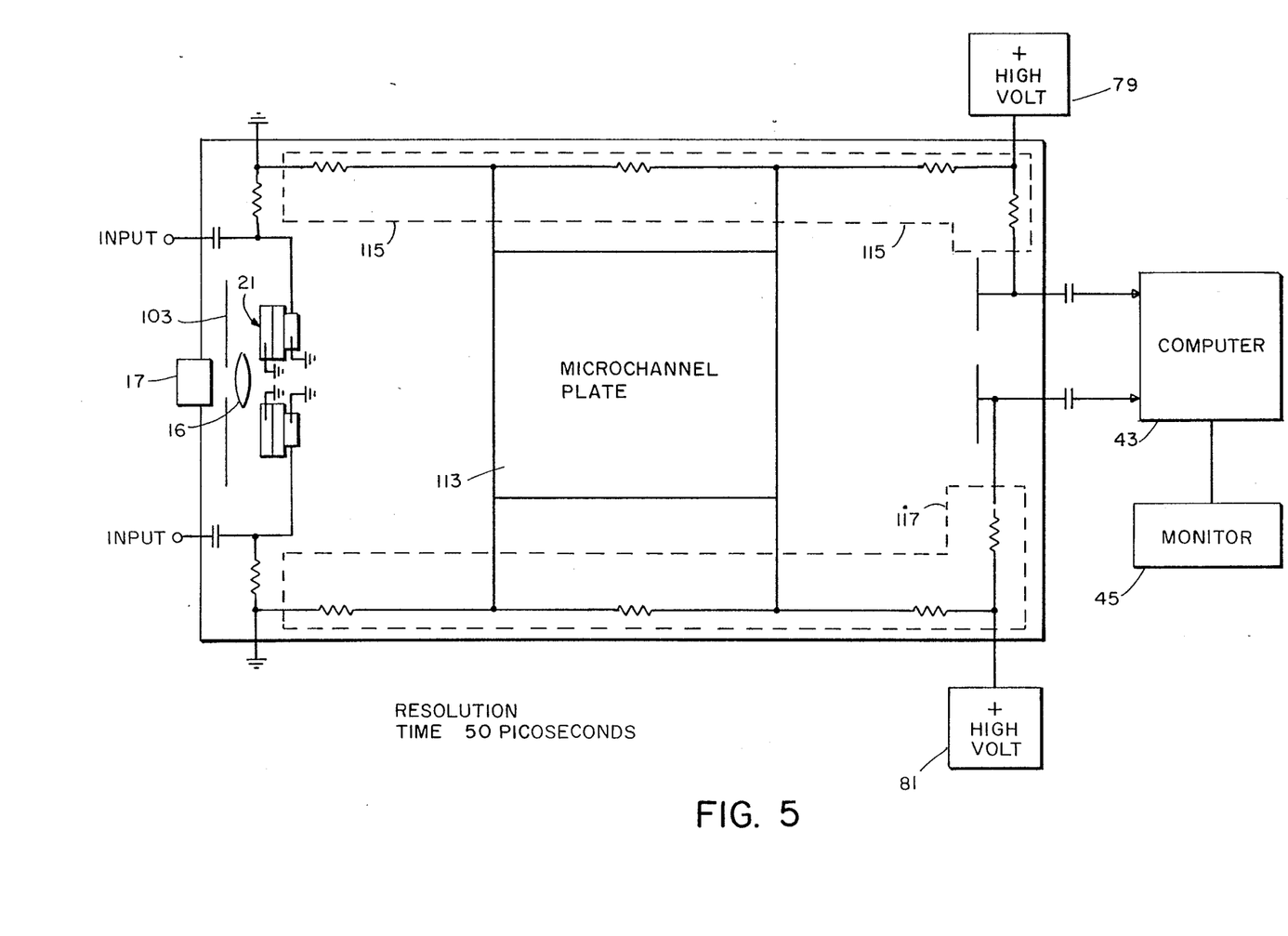
FIG. 5 is a schematic diagram of another embodiment of an oscilloscope constructed according to the teachings of the present invention.

In FIG. 5 there is shown a modification 111 of the FIG. 4 embodiment where the dynode chains 83 and 85 are replaced with a single microchannel plate 113 and divider circuits 91 and 93 by divider circuits 115 and 117.

Figure 6:
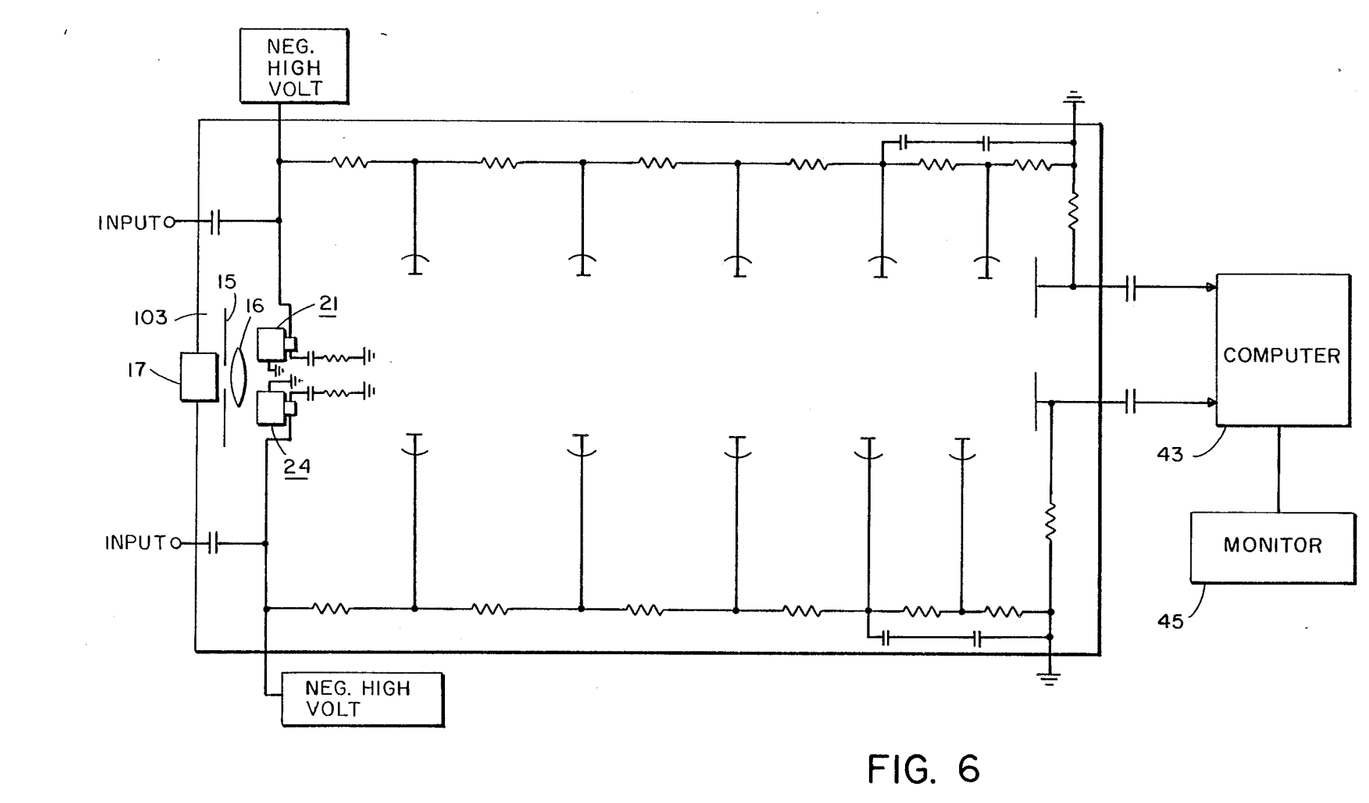
FIG. 6 is a schematic diagram taken from the side of another embodiment of an oscilloscope constructed according to the teachings of the present invention.

In FIG. 6 there is shown of modification 121 of the FIG. 4 embodiment where the high DC (bias) voltage sources 123 and 123 are negative (rather than positive) and at the photocathode end rather than the anode end and connected through divider circuits 125 and 127.

In the streak camera and the photomultiplier tube versions of the invention, the time resolution obtainable is about one picosecond or one terahertz.

In another embodiment of the invention, an input is coupled to the second photocathode in the streak camera in FIG. 3 so that voltage signals can be applied to both photocathode. The computer in all embodiments of the invention may store as well as process the information received.

An additional advantage in replacing the total area type photocathode in a photomultiplier tube with a strip line photocathode is the reduction of the dark current. The ejection of electrons from the photocathode in a photomultiplier tube, caused by ambient thermal heating, is a source of noise (dark current). By matching the output slit size of a spectrometer whose output is being detected by the photomultiplier tube to the width of the strip line or to a fiber optic bundle connecting the output of the spectrometer to the photomultiplier tube, the electrons emitted from the photocathode will primarily be due to the incident photons from the output slit of the spectrometer and only a small percent will be due to dark current. The dark current is proportional to the area of the cathode. The reduction of dark current of a photocathode with an area of 100 $\mu$m $\times$ 1 cm compared to a photocathode with an area of 3 cm $\times$ 3 cm (a conventional photocathode) is a more than a factor of a 1000. This decrease in background noise will yield a better signal to noise ratio S/N as shown below: for $I_o > I_{dark}$ where $I_o$ is the signal current and $I_{dark}$ is the current do to thermal emission and all other sources of noise.

Figure 7:
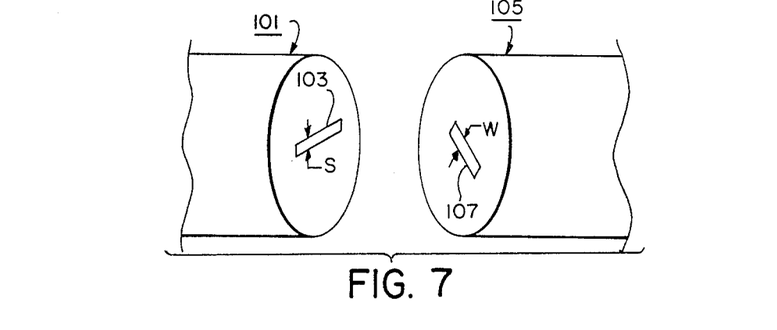
FIG. 7 is a simplified diagram of photomultiplier tube having a photocathode according to this invention in combination with a spectrometer, the photocathode being configured to improve the signal to noise ratio.

A spectrometer 101 having an output slit 103 and a photomultiplier tube 105 having a strip line photocathode 107 constructed as set forth above is show in FIG. 7, with the size S of the slit 103 being equal to the width W of the photocathode 107.

The embodiments of the present invention are intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. An oscilloscope for use in generating a time resolved profile of an ultrafast voltage signal comprising:
    (a) means for generating a constant beam of light;
    (b) a streak camera including a housing having disposed therein:
        (i) a transmission line photocathode upon which said beam of light impinges,
        (ii) means connected to said transmission line photocathode for receiving a voltage signal to be examined,
        (iii) whereby a number of electrons will be emitted from said transmission line photocathode as the voltage signal and the beam of light temporally and spatially intersect on said photocathode, the number of emitted electrons being proportional to the intensity of the voltage signal,
        (iv) an accellerating mesh for accelerating the emitted electrons away from the photocathode,
        (v) means for angularly deflecting the electrons as a function of time, (iv) electron multiplication means for performing electron multiplication on the deflected electrons, (v) a phosphor screen upon which the multiplied electrons impinge to create a light image proportional in intensity to the number of electrons incident thereto, (vi) bias voltage means connected to said photocathode, said accelerating mesh, said means for angularly deflecting the electrons as a function of time, said multiplication means, and said phosphor screen, for creating a potential difference sufficient to convey the electrons from said transmission line photocathode to said phosphor screen;

(c) a video camera focused on said phosphor screen for recording the light image appearing thereon;

(d) computer means for digitizing and processing and/or storing the output of the video camera, and (e) a monitor connected to said computer means for displaying the time resolved profile of the voltage signal.

2. The oscilloscope of claim 1 wherein said deflection means comprises a pair of sweeping electrodes, a sweep generator for supplying a sweeping voltage to said electrodes, and trigger means for triggering the emission of the sweeping voltage from said sweep generator.

3. The oscilloscope of claim 2 wherein said triggering means comprises a delay unit for synchronizing the emission of the sweeping voltage with the arrival of the electrons at said sweeping electrodes and a switch.

4. The oscilloscope of claim 3 wherein said electron multiplication means comprises a microchannel plate.

5. An oscilloscope for use in generating a time resolved profile of an ultrafast voltage signal, said oscilloscope comprising:

(a) means for generating a continuous beam or pulse of light;

(b) a streak camera including a housing having an aperture through which said beam of light passes, said housing having disposed therein:

(i) a first transmission line photocathode, (ii) a second transmission line photocathode, (iii) input means connected to said first transmission line photocathode for receiving an ultrafast test voltage signal, (iv) whereby a number of electrons are emitted from said first photocathode as the test voltage and the beam of light intersect in time and space thereon, the number of electrons being related to the intensity of the test voltage pulse, and (v) whereby a number of electrons are simultaneously emitted from said second photocathode, the number of electrons emitted therefrom being attributable to background noise, (vi) an accelerating mesh for accelerating the emitted electrons from the photocathode, (vii) means for angularly deflecting the electrons as a function of time, (viii) electron multiplication means for performing electron multiplication on the deflected electrons, (ix) first and second phosphor screens upon which the multiplied electrons derived from said first and second photocathodes, respectively, impinge and create separate a light images thereof, the intensity of each image being proportional to the number of electrons impinging thereon from each photocathode, (x) bias voltage means, connected to said first and second photocathodes, said accelerating mesh, said means for angularly deflecting the electrons as a function of time, said multiplication means, and said first and second phosphor screens, for creating a potential difference sufficient to convey the emitted electrons from said first and second photocathodes to said first and second phosphor screens, respectively, (c) means for recording the light images on said phosphor screen; and (d) means for digitizing the light images and subtracting one image from the other;

(e) a monitor for displaying the subtracted image.

6. The oscilloscope of claim 5 wherein said deflection means comprises a pair of sweeping electrodes, a sweep generator for supplying a sweeping voltage to said electrodes, and trigger means for triggering the emission of the sweeping voltage from said sweep generator.

7. The oscilloscope of claim 6 wherein said triggering comprises a delay unit for synchronizing the emission of the sweeping voltage with the arrival of electrons at said sweeping electrodes.

8. The streak camera system of claim 7 wherein said electron multiplication means comprises a microchannel plate.

9. An oscilloscope comprising:

a. means for generating a continuous beam or pulse of light;

b. a photomultiplier tube including a housing having an aperture through which said beam of light passes, said housing having disposed therein;

i. a first transmission line photocathode, ii. a second transmission line photocathode, iii. input means connected to each photocathode for receiving a voltage signal, iv. electron multiplication means for performing electron multiplication on electrons emitted by the photocathodes, ix. a first anode upon which the multiplied electrons derived from said first photocathode impinge and produce therein a first output signal, x. a second anode disposed so that the multiplied electrons derived from said second photocathode impinge thereon and produce therein a second output signal, xi. bias voltage means, connected to said first and second photocathodes, said multiplication means and said first and second anodes for creating a potential difference sufficient to convey the emitted electrons from said first and second photocathodes to said first and second anodes, respectively, c. computer means for processing the output signals at each anode and producing therein processed signals, and d. a monitor for displaying the processed signals.

10. The oscilloscope of claim 9 and wherein the electron multiplication means comprises a pair of dynode chains.

11. The oscilloscope of claim 9 and wherein the electron multiplication means comprises a pair of microchannel plates.

12. The oscilloscope of claim 5 and further including input means connected to said second photocathode.

13. In combination:

a. a spectrometer having an output slit, and b. a photomultiplier tube having a transmission strip line photocathode, the width of the transmission strip line photocathode matching the size of the output slit of the spectrometer.

* * * * *